United States Patent
Ahmadi et al.

(10) Patent No.: US 6,530,823 B1
(45) Date of Patent: Mar. 11, 2003

(54) METHODS FOR CLEANING SURFACES SUBSTANTIALLY FREE OF CONTAMINANTS

(75) Inventors: Goodarz Ahmadi, Potsdam, NY (US); Paul E. Lewis, San Jose, CA (US); Adel George Tannous, Santa Clara, CA (US); Khalid Makhamreh, Santa Clara, CA (US); Keith H. Compton, San Jose, CA (US)

(73) Assignee: Nanoclean Technologies Inc, San Jose, CA (US)

(*) Notice: Subject to any disclaimer, the term of this patent is extended or adjusted under 35 U.S.C. 154(b) by 0 days.

(21) Appl. No.: 09/636,265

(22) Filed: Aug. 10, 2000

(51) Int. Cl.$^7$ ................................................. B24B 1/00
(52) U.S. Cl. ............................ 451/39; 757/37; 757/38; 757/89; 134/9; 134/32
(58) Field of Search ........................... 451/39, 89, 37, 451/5, 2, 78, 80, 36, 38, 40; 136/9, 32, 6, 7, 72, 61, 68, 15, 19, 25.1, 25.5, 4.2, 902, 129, 172

(56) References Cited

U.S. PATENT DOCUMENTS

| | | |
|---|---|---|
| 4,806,171 A | 2/1989 | Whitlock et al. |
| 4,854,091 A * | 8/1989 | Hashish et al. ............... 451/37 |
| 5,062,898 A | 11/1991 | McDermott et al. |
| 5,107,764 A | 4/1992 | Gasparrini |
| 5,108,512 A | 4/1992 | Goffnett et al. |
| 5,209,028 A | 5/1993 | McDermott et al. |
| 5,217,925 A | 6/1993 | Ogawa et al. |
| 5,315,793 A | 5/1994 | Peterson et al. |
| 5,354,384 A | 10/1994 | Sneed et al. |
| 5,364,472 A * | 11/1994 | Heyns et al. ................... 134/7 |
| 5,417,768 A | 5/1995 | Smith, Jr. et al. |
| 5,456,629 A | 10/1995 | Bingham |
| 5,482,564 A | 1/1996 | Douglas et al. |
| 5,514,024 A | 5/1996 | Goenka |
| 5,564,159 A * | 10/1996 | Treiber ......................... 15/302 |

(List continued on next page.)

FOREIGN PATENT DOCUMENTS

| | | | |
|---|---|---|---|
| WO | 92/032269 | * 3/1992 | .................. 451/38 |

OTHER PUBLICATIONS

High Pressure Cleaning System for Disks, IBM Technical Disclosure Bulletin, Jan. 1983.*

*Primary Examiner*—George Nguyen
(74) *Attorney, Agent, or Firm*—Loudermilk & Associates

(57) ABSTRACT

A cryogenic cleaner for and a method of performing cleaning of a surface that must be substantially free of contaminants has a resiliently mounted nozzle for spraying a cryogenic cleaning medium on the surface. The nozzle is driven in an oscillatory manner at a predetermined amplitude and frequency so the nozzle spray is delivered in a manner to provide pulsing of the spray and to provide as "snow plow" effect on contaminants as the spray delivers the cleaning medium against the surface. The surface is transported past the nozzle, and the cleaning occurs in an enclosed controlled environment.

50 Claims, 6 Drawing Sheets

U.S. PATENT DOCUMENTS

| | | | |
|---|---|---|---|
| 5,571,335 A | 11/1996 | Lloyd | |
| 5,616,067 A | 4/1997 | Goenka | |
| 5,632,150 A | 5/1997 | Henzler | |
| 5,651,834 A | 7/1997 | Jon et al. | |
| 5,669,251 A | 9/1997 | Townsend et al. | |
| 5,715,852 A | 2/1998 | Jepsen | 134/167 |
| 5,733,174 A | 3/1998 | Bingham et al. | 451/39 |
| 5,754,580 A | 5/1998 | Kotani et al. | |
| 5,765,578 A | 6/1998 | Brandt et al. | |
| 5,766,061 A | 6/1998 | Bowers | |
| 5,766,368 A | 6/1998 | Bowers | |
| 5,775,127 A | 7/1998 | Zito | |
| 5,794,854 A | 8/1998 | Yie | 239/242 |
| 5,804,826 A | 9/1998 | Borden et al. | |
| 5,806,544 A | 9/1998 | Kosic | |
| 5,833,918 A | 11/1998 | Matossian et al. | |
| 5,836,809 A | 11/1998 | Kosic | |
| 5,837,064 A | 11/1998 | Bowers | |
| 5,853,128 A | 12/1998 | Bowen et al. | |
| 5,858,107 A | 1/1999 | Chao et al | |
| 5,928,434 A | 7/1999 | Goenka | |
| 5,961,732 A | 10/1999 | Patrin et al. | |
| 5,989,355 A | 11/1999 | Brandt et al. | |
| 6,066,032 A * | 5/2000 | Borden et al. | 451/80 |
| 6,099,396 A * | 8/2000 | Krone-Schmidt | 451/80 |
| 6,126,524 A | 10/2000 | Shepherd | 451/75 |
| 6,273,790 B1 * | 8/2001 | Neese et al. | 451/38 |

* cited by examiner

METHODS FOR CLEANING SURFACES SUBSTANTIALLY FREE OF CONTAMINANTS

FIELD OF THE INVENTION

This invention relates to systems and methods for cleaning surfaces on hard disks, semiconductor wafers, delicate optics, etc., with an oscillating nozzle cleaning system, preferably dispensing cryogenic, solvent or solvent combination cleaning mediums.

BACKGROUND OF THE INVENTION

Articles such as hard disks, semiconductor wafers, delicate optics, etc., often must precisely cleaned in order to remove contaminants, either during or after the process for manufacturing the articles. A variety of cleaning methods have been employed with varying degrees of success. Certain of such methods that have been attempted involve imparting carbon dioxide snow onto the article to be cleaning.

An example of such a conventional system is described in U.S. Pat. No. 5,766,06 1. As a general/summary description of this system, a conveyor transports a wafer carrying cassette to be cleaned through an enclosure. Jet spray nozzles generate carbon dioxide spray that cleans the cassettes. While methods such as described in this patent provide a certain level of cleaning efficacy, improved methods for cleaning a variety of articles are still very much in demand.

SUMMARY OF THE INVENTION

The present invention relates to systems and methods preferably using a cryogenic cleaning medium for cleaning a surface on an article. A summary of an exemplary preferred embodiment is as follows. An enclosure is provided for maintaining a controlled environment during the cleaning process. The enclosure provides ingress and egress from and to a surrounding environment. A holding chuck is provided that is configured to secure the article to be cleaned. A stage or stage means is mounted on the support structure and the holding chuck is mounted on the stage means in a manner so that movement of the article relative to the support structure is provided within the enclosure on a predetermined path between the ingress and the egress points. A preheater is mounted in a first position adjacent the predetermined path in thermal communication with the surface of the article at the first position. A cryogenic spray nozzle assembly is provided wherein a spray nozzle is mounted in the spray nozzle assembly. The spray nozzle is in communication with the cryogenic cleansing medium for providing a cleaning spray at a second position adjacent the predetermined path so that the cleaning spray impinges on the surface to be cleaned at the second position. A post heater is mounted in a third position adjacent to the predetermined path in thermal communication with the surface of the article at the third position. The cryogenic spray nozzle assembly further includes means for imparting cyclic motion in the spray nozzle so that the cleaning spray is moved bidirectionally relative to the predetermined path.

In another aspect of the present invention, systems and methods are provided for cleaning a surface of an article, wherein a preferred system includes a frame work, a holding means that holds the article with the surface exposed, and means for moving the holding means along a predetermined path. A nozzle having a nozzle axis and a nozzle tip is spaced from and adjacent to the predetermined path for delivering a cleaning spray onto the article surface. Means is mounted between the framework and the nozzle for supporting and driving the nozzle tip through a cyclic motion.

In yet another aspect of the present invention, an oscillating nozzle assembly for use in cryogenic cleaning of a surface of an article that must be cleaned substantially free of contaminants is provided. The oscillating nozzle assembly includes an assembly mounting block, a nozzle mounting block, and means for resiliently connecting the nozzle mounting block to the assembly mounting block. Further, the oscillating nozzle assembly includes an eccentric and a driver connected to the eccentric. In addition, means is provided for mounting the eccentric and the driver between the nozzle mounting block and the assembly mounting block. At least one nozzle is included having a nozzle tip, wherein the nozzle is mounted on the nozzle mounting block so that the driver operates to move the nozzle tip cyclically when the driver is energized.

In yet another aspect of the present invention, the oscillating nozzle assembly for dispensing a cleaning medium toward a surface on an article includes a nozzle, a tip on the nozzle for dispensing the cleaning medium, and means for mounting the nozzle. A nozzle assembly base is included together with means for controllably moving the means for mounting the nozzle relative to the nozzle assembly base in a cyclic pattern having a predetermined frequency and amplitude.

Methods in accordance with the present invention relate to processing an article having a surface to be cleaned substantially free of contaminates. The process includes the steps of performing a plurality of pre-cleaning fabrication steps, conducting a cleaning process at a cleaning position using a cleaning spray, and performing a plurality of post-cleaning fabrication steps. The step of conducting a cleaning process includes the steps of transporting the surface to be cleaned to the cleaning position together with positioning the surface to be cleaned proximate to the cleaning spray at the cleaning position. Further, the step of oscillating the cleaning spray at the cleaning position in a predetermined pattern is performed to provide improved cleaning in accordance with the present invention.

BRIEF DESCRIPTION OF THE DRAWINGS

The present invention may be more fully understood by a description of certain preferred embodiments in conjunction with the attached drawings in which.

DETAILED DESCRIPTION OF THE PREFERRED EMBODIMENTS

The present invention will be described in greater detail with reference to certain preferred embodiments and certain other embodiments, which may serve to further the understanding of preferred embodiments of the present invention. As described elsewhere herein, various refinements and substitutions of the various embodiments are possible based on the principles and teachings herein.

Very small quantities of contamination are detrimental to the fabrication processes involved in producing integrated circuit wafers, hard discs, optical elements, etc. Contamination in the form of particulates, films, or microscopic clusters of molecules can produce fatal defects in any of the aforementioned products before, during or after fabrication processes. Cleaning of the surfaces on these products is therefore essential at various phases during fabrication. Cryogenic cleaning of surfaces utilizing impingement of solid particles of relatively inert gases such as argon and $CO_2$ are known and the manner in which solid particles of such gases are generated for cleaning purposes need not be described herein. Without being bound by theory, in such cases it is thought that the combination of sublimation of the solid particles as they impinge the surface to be cleaned as well as the impact momentum transfer by the particles provides the vehicle for removing contamination from a surface. It is further recognized that sublimation occurs, and therefore a major portion of the cleaning, only while the surface to be cleaned is at a higher temperature than that of the cryogenic spray. The thermophoresis due to the heated surface also helps to remove the particles from the surface and reduce the chance for re-deposition of the detached particles. As a consequence, pre-heating and post-heating of the surface being cleaned is required within the vicinity of the impinging cleaning spray. Cleaning by various other solvents and solvent combinations where the levels of residual contaminants following the cleaning process need not be held quite as low, is also envisioned for use in the systems and methods of the present invention.

Figure 1:
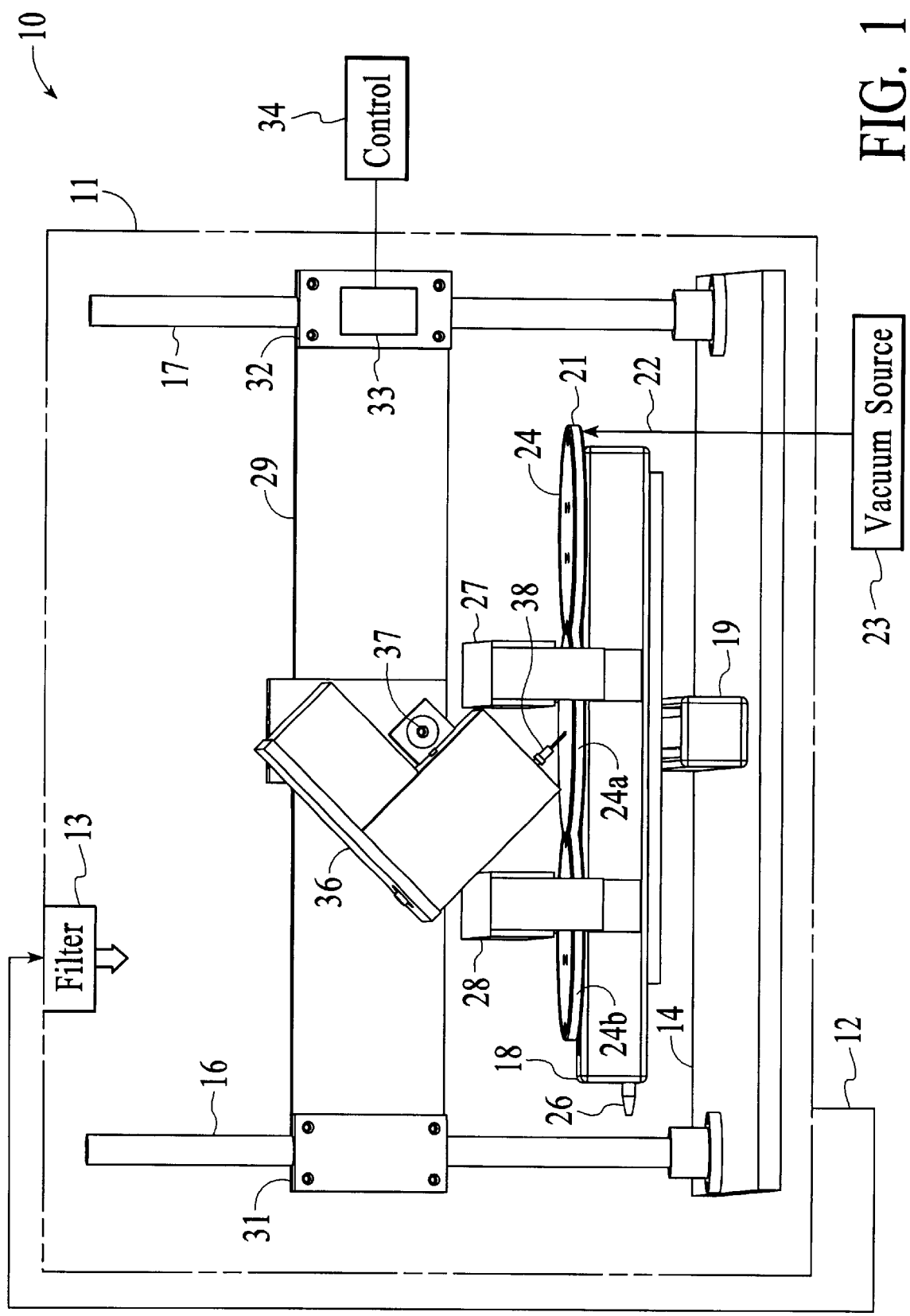
FIG. 1 is a perspective showing one embodiment of the system of the present invention.

Reference is now made to FIG. 1 of the drawings, wherein one exemplary embodiment of the present invention is illustrated. A system 10 is shown in FIG. 1 having an enclosure 11 depicted in phantom line. The environment within the enclosure is maintained at a level of cleanliness depending on the level of cleanliness to be imposed on articles to be cleaned within the enclosure. A scavenging line 12 is shown exiting the enclosure 11 at the bottom thereof and proceeding to a filter 13 for removing particulates from the enclosure environment that may be generated by the cleaning process or by mechanical components within the enclosure. Rudimentary support structure is shown including a base plate 14 and two uprights 16 and 17 attached at their bases to the base plate. The description herein makes reference to an XYZ coordinate system, wherein the Z direction is substantially vertical and the mutually orthogonal Z and Y axes are substantially horizontal. An XY stage is shown having an X stage 18 for movement on a Y stage 19, that is mounted on the base plate 14 (other X/Y stage configurations are within the scope of the present invention). A holding chuck 21, in this instance a vacuum chuck connected through a line 22 to a vacuum source 23, is mounted for movement on the X stage 18. An article to be cleaned, in this exemplary illustration an integrated circuit wafer 24, is shown in FIG. 1 mounted to the vacuum chuck 21 and held in place by known means (e.g., held in place by the vacuum). FIG. 1 shows the integrated circuit wafer 24 in an initial position, and subsequently in a cleaning position at 24a and a post-heating position at 24b. The integrated circuit wafer 24 preferably is transportable along a predetermined path governed by the movement of the X stage 18 on the Y stage 19 and the movement of the vacuum chuck 21 on the X stage 18. Chuck 21 is driven over the upper surface of the X stage by known means, which may include a carriage portion within the X stage driven by a lead screw and a servo motor (not shown), for example. A cable connection 26 is shown at one end of the X stage for introducing power to energize the aforementioned servo motor. A similar cable connection (not shown) is provided to power the Y stage 19 so that the X stage, mounted on a moveable carriage of the Y stage, may be moved in the Y direction by a lead screw and servo motor similar to that mentioned hereinbefore in conjunction with the X stage.

From the foregoing it is seen that the integrated circuit wafer 24 shown in an initial position in FIG. 1 may be moved to the left in FIG. 1 to pass beneath a pre-heater 27 at a pre-heat position along the aforementioned predetermined path, which preferably pre-heats the integrated circuit wafer prior to cleaning. Further movement of the chuck 21 brings the integrated circuit wafer to a cleaning position indicated in FIG. 1 at 24a. Continuing movement of the chuck along the predetermined path defined by the X and Y stages 18 and 19 delivers the integrated circuit wafer to a post-heat position shown at 24b, wherein post-heating of the integrated circuit wafer preferably is performed by a post-heater 28. The pre and post heaters may be infra red lamps or other heating sources. These heaters preferably impart surface temperatures to the article that enhance cleaning, prevent re-contamination and remove static electricity. In alternative embodiments, the pre and post heaters are supplemented with, or replaced by, a heated vacuum chuck, with the heated vacuum chuck providing heat to the article to be cleaned, etc. The use of such a heated vacuum chuck also may be used in accordance with other embodiments of the present invention as described herein.

A nozzle assembly support plate 29 is shown extending between the two uprights 16 and 17. The support plate preferably is attached at the upright 16 in a Z position by a friction clamp 31. The support plate 29 preferably is mounted on the opposing end to upright 17 in the Z position by an additional friction clamp 32. It should be noted that the position of the. mounting plate 29 in the Z direction may be governed by a servo motor 33 and associated mechanism (not shown) similar to that of the X and Y stages, so that the Z position of the support plate 29 is dictated by a control 34, which may controllably raise or lower the support plate 29 either before, during or after cleaning or other processing.

A spray nozzle assembly 36 is shown mounted to the support plate 29 at a pivot 37. A nozzle 38 is shown extending from the spray nozzle assembly 36 at a lower portion thereof at the cleaning position shown by the position of integrated circuit wafer 24a in FIG. 1. A preferred exemplary angle of the nozzle 38 to the surface to be cleaned on the integrated circuit wafer 24 is seen in FIG. 1 to be obtuse to the direction of approach of the integrated circuit wafer. Expressed alternatively, the angle of the nozzle 38, and the subsequent spray emitted therefrom, is acute to the downstream portion of the predetermined path along which the wafer travels on the XY stage. The point to be made here is that the spray emanating from the spray nozzle 38 preferably is set to impinge the surface to be cleaned at an angle to facilitate contaminant removal and to add any velocity of the surface to be cleaned to the spray velocity for purposes of enhancing contaminant removal. That angle of impingement as seen in FIG. 1 preferably is adjustable by moving the spray nozzle assembly 36 rotationally about the pivot 37 and fixing the angle in the adjusted position.

It should also be noted that, in preferred embodiments, one or more jets for cleaning an article, with the oscillatory-type movement of the present invention, such jets, although having a non-uniform spray pattern, may result in a more substantially uniform and improved spray distribution due to the oscillatory-type movement, which preferably enables an article to be more uniformly cleaned in a single pass, etc.

Figure 2:
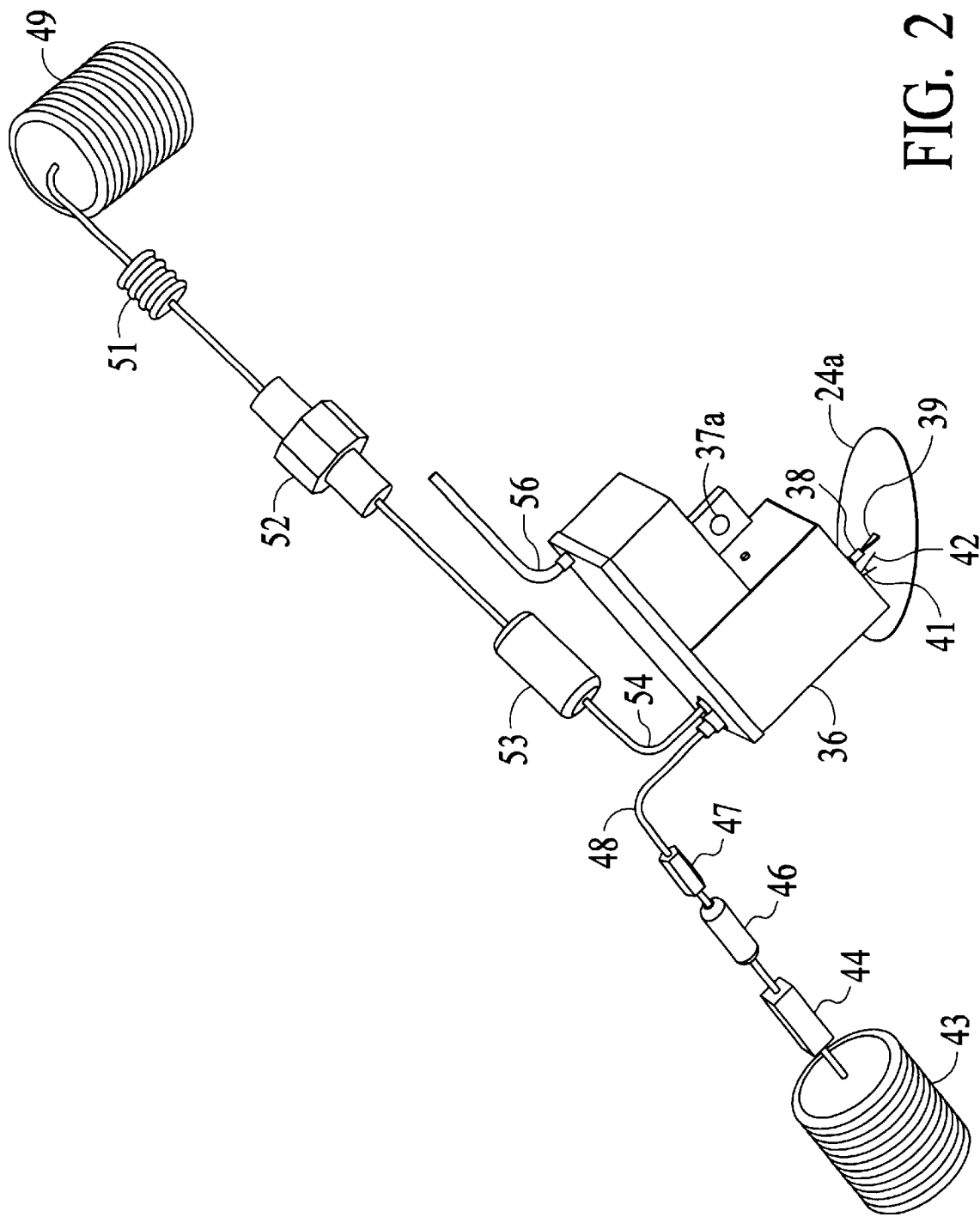
FIG. 2 is a schematic showing gas and vacuum paths for one embodiment of the system of the present invention.

Turning to the diagram of FIG. 2, the spray nozzle assembly 36 is shown poised in position above the integrated circuit wafer in the position represented by 24a wherein the wafer is moving to the left in FIG. 2 relative to the spray nozzle assembly. Nozzle 38 is shown directing a cleaning spray 39 onto the surface of the article to be cleaned (integrated circuit wafer 24a in FIG. 2) at the spray impingement angle referred to hereinbefore in conjunction with FIG. 1. A second spray nozzle 41 is shown just visible in the diagram of FIG. 2 for preferably delivering a heated inert gas spray 42 for heating, drying and removing static electricity from the surface just cleaned by the spray 39. The heated inert gas spray nozzle 41 may fill the requirements of the post-heater 28 shown in FIG. 1. Details of construction of the nozzles 38 and 41 will be described in more detail hereinafter.

FIG. 2 shows an inert gas source 43 connected through a flow line to a temperature control module 44 and subsequently to a gas filter 46. Inert gas flow is subsequently directed through an ionizer 47 and a flexible line 48 to the nozzle 41 contained in the spray nozzle assembly 36. A cleaning medium container 49 (such as an argon or $CO_2$ gas container) preferably is connected through a gas flow line to a temperature control 51. The temperature controlled cleaning medium preferably is connected to a pressure booster 52 and subsequently to a filter 53 for removing contaminants. The filtered, temperature controlled and pressurized cleaning medium preferably is connected through a flexible line 54 to the nozzle 38 in the spray nozzle assembly 36. The manner in which a gas cleaning medium is conditioned for cryogenic cleaning is known, and teachings from the art submitted contemporaneously herewith are incorporated herein by reference. In certain applications the cleaning medium contained in the container 49 may be a solvent different from the cryogenic gas, known to those in this art, descriptions of which will not be undertaken here. A flexible vacuum line 56 is shown in FIG. 2 to remove contaminants generated by functions taking place within the case of the spray nozzle assembly 36 so that they are not deposited upon the surface to be cleaned. The flexible vacuum line 56 is led to the outside of the enclosure 11 when the system containing the spray nozzle assembly 36 is enclosed therein. The location of the pivot 37 of FIG. 1 is shown by the hole 37a depicted in FIG. 2.

Figure 3:
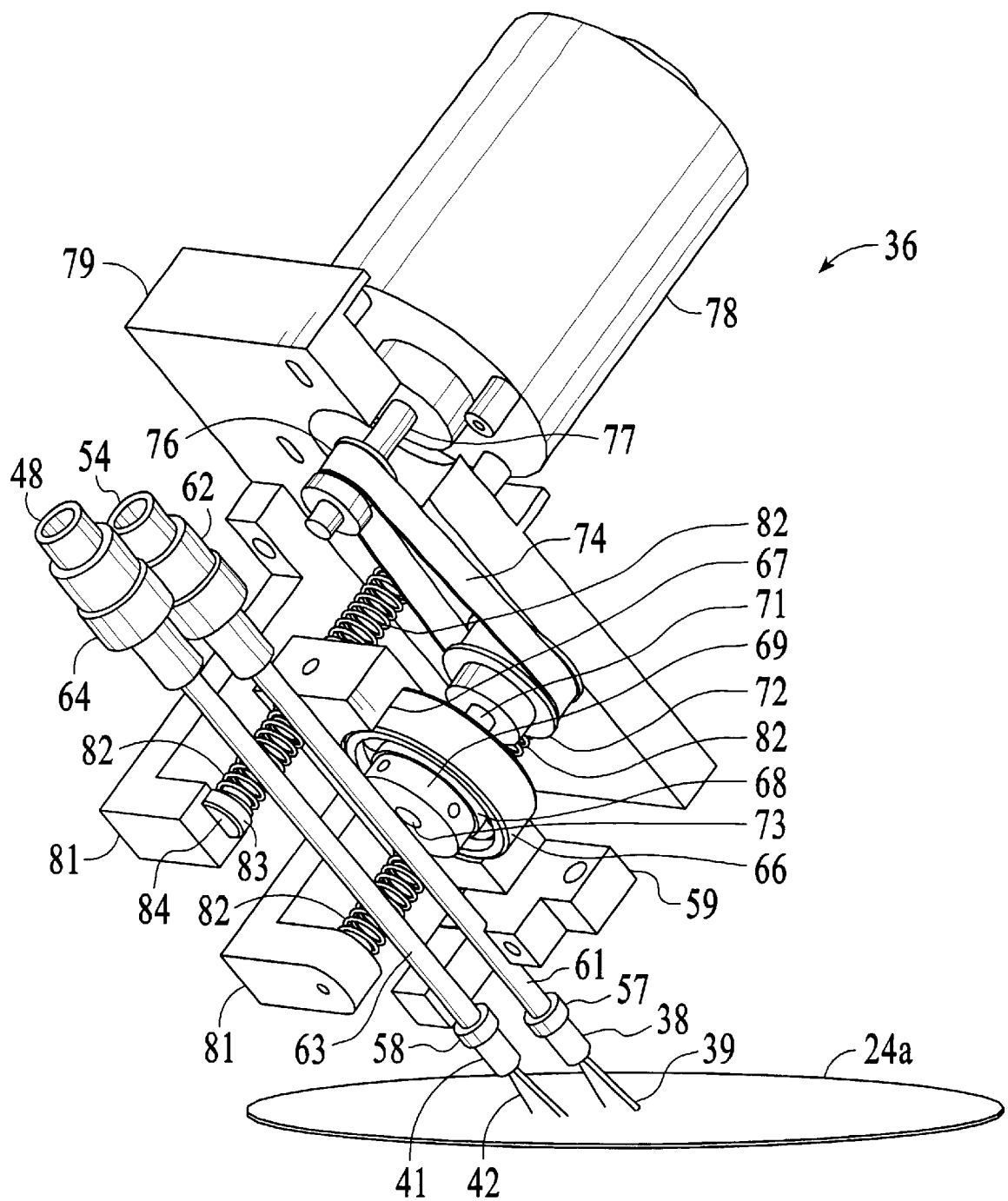
FIG. 3 is a perspective of one embodiment of the spray nozzle assembly of the present invention with the outer cover removed.

FIG. 3 depicts the spray nozzle assembly 36 with the cover removed. The article to be cleaned represented by the integrated circuit wafer 24a is seen to be moving to the left in FIG. 3 relative to the spray nozzle assembly. The spray nozzle assembly is pivoted about the pivot 37 (FIG. 1) to assume the position shown in FIG. 3 so that the cleaning nozzle 38 dispenses the cleaning spray 39 at an obtuse angle relative to the approaching portion of the surface to be cleaned. The cleaning nozzle 38 preferably has a nozzle axis and a nozzle tip with an elongated nozzle opening therein to provide the exemplary preferred fan-shaped spray 39 seen in FIG. 3. A friction lock 57 is shown as a ring on the nozzle 38, and may be a conventional friction lock ring, which allows the tip of the nozzle to be rotated around the nozzle axis and to be locked in the rotated position (as will be understood by those in the art, such a friction lock ring may be loosened, thereby enabling an adjustment to be made, such as a rotation, and then the friction lock ring may be tightened to preserve the state of adjustment, in this case a degree of rotation). Rotation of the tip of nozzle 38 preferably allows the fan-shaped spray 39 to impinge the surface to be cleaned at an angle of rotation about the nozzle axis. This angle of rotation allows the fan-shaped spray 39 to push contaminates to one side of the surface to be cleaned as to the spray nozzle is oscillated to thereby affect a "snow plow" function. This will be further explained in conjunction with the description of the oscillation of the nozzle 38. In like fashion, nozzle 41 for dispensing inert drying gas, preferably has a friction lock 58 functioning in the same manner as the friction lock 57 on nozzle 38. Nozzle 41 also has a tip with an elongated opening therein for preferably producing a fan shaped emission of inert drying gas 42. Nozzle 38 preferably is attached to a nozzle mounting block 59 through a tube 61 and a connector 62 coupling the nozzle 38 to the flexible line 54 (FIG. 2). Nozzle 41 also preferably has a tube 63 connected thereto which is mounted in the nozzle mounting block 59. A connector 64 connects the tube 63 to the flexible line 48 (FIG. 2) to deliver heated inert gas to the surface to be cleaned immediately after cleaning when that method is used for post-heating of and removal of static charge from the surface being cleaned.

Nozzle mounting block 59 in FIG. 3 is cut away to show installation of the outer diameter of an outer bearing race 66 mounted within a bore 67 in the nozzle mounting block. An inner race 68 on the bearing within the bore 67 has an eccentric cam-member 69 mounted therein. A shaft 71 on a pulley 72 is passed through an offset hole 73 in the eccentric cam and fixed therein. The pulley 72 is driven by a belt 74 which in turn is driven by a pulley 76 mounted on the end of a shaft 77 driven by a motor 78. The motor 78 is mounted in a motor mount block 79 (partly cut away for clarity) secured to the outer case of the spray nozzle assembly 36. The motor mount block 79 also serves to mount the pulley 72 for rotation thereon. A plurality of arms 81, two of which are shown in FIG. 3, are fastened to the motor mounting block 79 extending outwardly therefrom to a position beyond the nozzle mounting block 59. Yieldable structure such as coil springs 82, extend from the ends of the arms 81 to the nozzle mounting block 59 and from the motor mounting block 79 to the opposing side of the nozzle mounting block 59. The ends of the coil springs 82 are encompassed by buttons or caps 83 that are seated in counter bores in the structural members 59, 79 and 81 that receive respective ends of the coil springs 82. The material for the end caps 83 is preferably Delrin AF. Very little particulate is sloughed off of the Delrin AF surfaces when the material is subjected to friction. As a result, the springs 82 are anchored on one end within the bores 84 at the ends of the arms 81 and in the motor mounting block 79 and anchored at an opposing end within bores 84 in the nozzle mounting block 59. Nozzle mounting block 59 is therefore suspended by the springs 82 in position spaced from the remainder of the spray nozzle assembly. Consequently, when the spray nozzles 38 and 41 are mounted on the nozzle mounting block 59, and when the nozzle mounting block is moved, the sprays 39 and 42 are moved relative to the surface to be cleaned on the integrated circuit wafer 24a in FIG. 3. An optimum offset from the geometric center of the offset cam 69 has been found to be about 0.075 inches. As a result an optimum peak to peak amplitude for cam excursion is about 0.150 inches. An optimum cam rotation frequency through the pulleys 76 and 72 has been found to be approximately 27.5 revolutions per second or about 27½ Hertz. Thus, in a preferred embodiment, the optimum amplitude provided by the cam 69 falls within the range of about 0.120 to 0.180 inches peak to peak. The optimum frequency falls within the range of about 25 to 30 Hertz Other amplitudes and frequencies for optimum cleaning of specific contaminants from surfaces are envisioned as within the scope of the present invention.

Springs 82, in this preferred embodiment, preferably have coils of 0.043 inch diameter stainless steel wire, with one half (½) inch diameter coils and lengths of one and one-half (1 ½) inches. Such springs generally should provide adequately support the mass of the nozzle mounting block 59 and members attached thereto. It should further be noted that motor 78 could be mounted on motor mounting block 79 to directly drive shaft 71 connected to the eccentric cam 69 in those instances where the rotational output speed of the motor shaft 77 imparts an acceptable frequency to the oscillatory motion induced by the rotation of the eccentric cam 69. In any event, the nozzle mounting block 59 and the nozzles 38 and 41 attached thereto are driven at a predetermined frequency and amplitude, so that the nozzles are driven in a circular pattern having a diameter of the peak to peak oscillation amplitude and a frequency determined by the rotational frequency of the eccentric cam 69. The physical dimensions of springs 82 will depend on the mass of the spray nozzle assembly 36. Therefore, heavier or lighter springs 82 may be used as the spray nozzle assembly assumes greater or lesser mass. It is noted that the preferred structure for imparting the cyclic motion to the nozzles 38 and 41 relative to the surface to be cleaned are exemplary.

Figure 4:
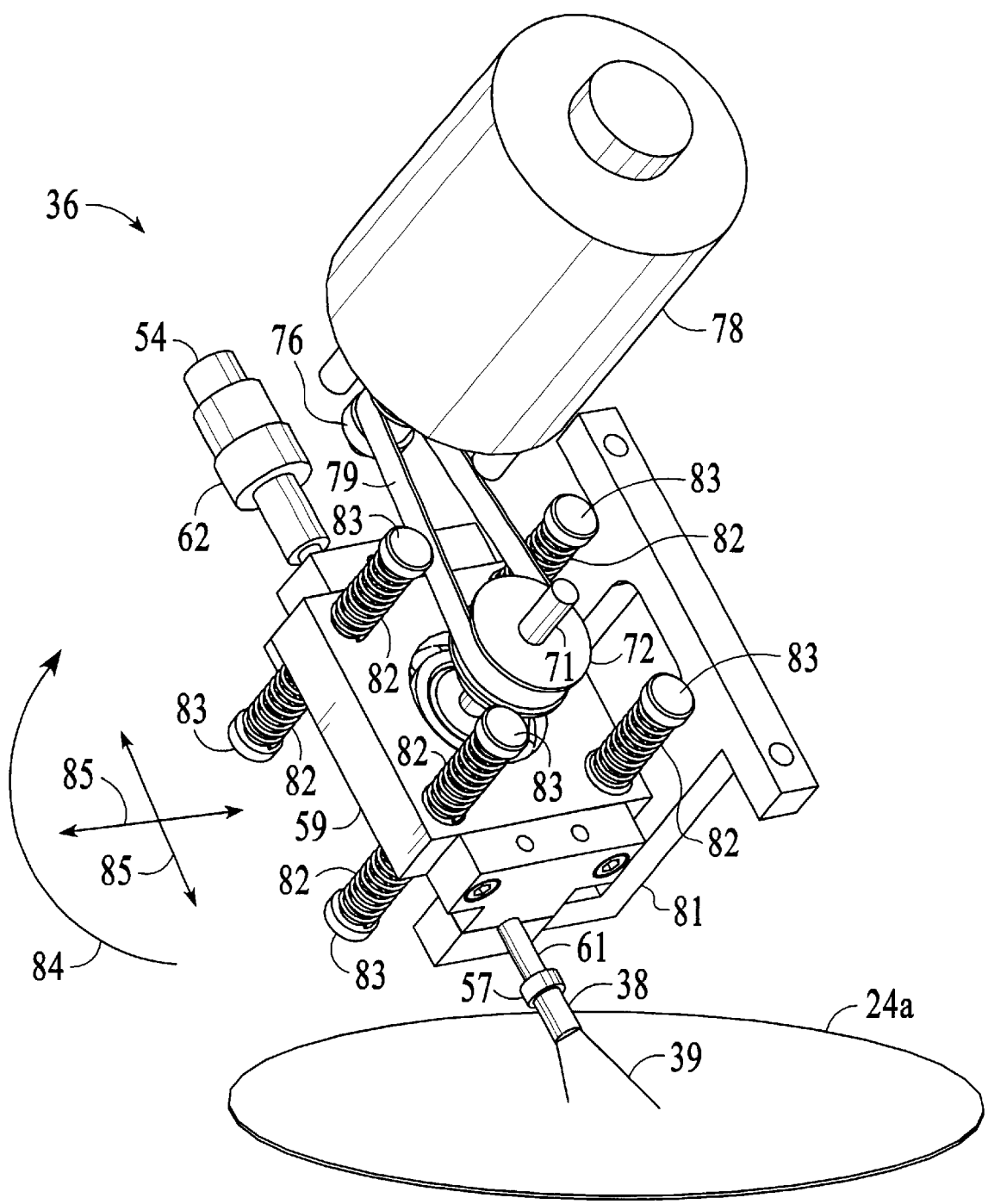
FIG. 4 is a perspective of another embodiment of the nozzle assembly of the present invention with the outer cover removed.

FIG. 4 depicts the spray nozzle assembly 36 with the motor mounting block 79 removed from the drawing for clarity. As seen in FIG. 4, a single nozzle 38 is shown having the aforementioned preferred elongated aperture therein for providing emission of the fan-shaped spray 39 for impingement on the surface to be cleaned. The surface shown in FIG. 4 is the surface of the integrated circuit wafer 24*a*. Friction lock 57 in the illustration of FIG. 4 is loosened and the nozzle 38 is rotated counter-clockwise (looking at the elongated aperture therein). The orientation of the aperture;of nozzle 38 is locked in the adjusted position by the friction lock 57. When the motor 78 is energized and an oscillation in the nozzle 38 is imparted by the oscillation of the-nozzle mounting block 59 on the support provided by the springs 82, the nozzle tip, and therefore the spray 39 describes a circular pattern at the predetermined amplitude and frequency. The rotation of the oscillation is indicated by the arrow 84 in FIG. 4.

The impingement of the spray pattern 39 on the surface to be cleaned is illustrated in FIG. 4. The nozzle 38 and the spray pattern 39 moves during half of each rotational cycle toward the integrated circuit wafer. Further, during the subsequent half of each rotational cycle the nozzle and spray move away from the wafer surface. This is seen when it is recognized that the nozzle tip describes a circle during oscillation, wherein the plane of the circle substantially includes an extension of the nozzle axis. This is illustrated in FIG. 4 by the rotational arrow 84 and the arrows 85 representing oscillation circle diameters. The nozzle 38 sweeps the spray 39 side to side on the wafer surface because the edge of the circle represented by diameters 85 appears as a straight line when viewed from the wafer surface.

Now considering the rotation of the flat fan shaped spray 39 about the nozzle axis by the adjustment of the friction lock 57, the fan 39 impinges the surface at a compound angle (displaced from the side to side sweep) preferably resulting in the "snow plow" effect of the fan-shaped spray 39 during half of each cycle as it rotates in the direction of the arrow 84. Further, the disclosed oscillation of the fan-shaped spray 39 provides the benefits of pulsing which enhances cleaning. Pulsing in the past has been provided in a spray by interrupting the spray periodically. However, such interruption causes the spray jet to lose optimum characteristics as the spray is cut off and restarted when the spray is a cryogenic cleaning medium comprised of solid gas particles. The pulsing occurs in the embodiments disclosed herein due to increasing velocity (or acceleration) as the spray 39 converges on the surface to be cleaned during one half (½) of the oscillatory cycle and the decrease in velocity (negative acceleration) as the spray 39 diverges from the surface to be cleaned during the other half of the oscillatory cycle. Spray nozzle 38 describing a circular pattern during oscillation as described hereinbefore, preferably lays down a laterally oscillating spray pattern on the surface to be cleaned. The angle of the spray pattern impingement on the surface is therefore formed by adjustment of the spray nozzle assembly 36 rotationally about the pivot 37 (FIG. 1) and adjustment to the spray fan orientation about the nozzle axis through adjustment of the friction lock 57. Pulsing and compound angle "snow plow" effects in cleaning are believed to provide advantages in obtaining thorough contaminant removal. It should be mentioned that the shaft 71 for driving the eccentric cam 69 (FIG. 3) could be driven directly by the motor 78, allowing elimination of the pulleys 72 and 76 and the belt 74 as discussed in conjunction with FIG. 3. On the other hand, selection of relative diameters of pulleys 72 and 76 may be used to adjust the frequency of oscillation if desired.

Figure 5:
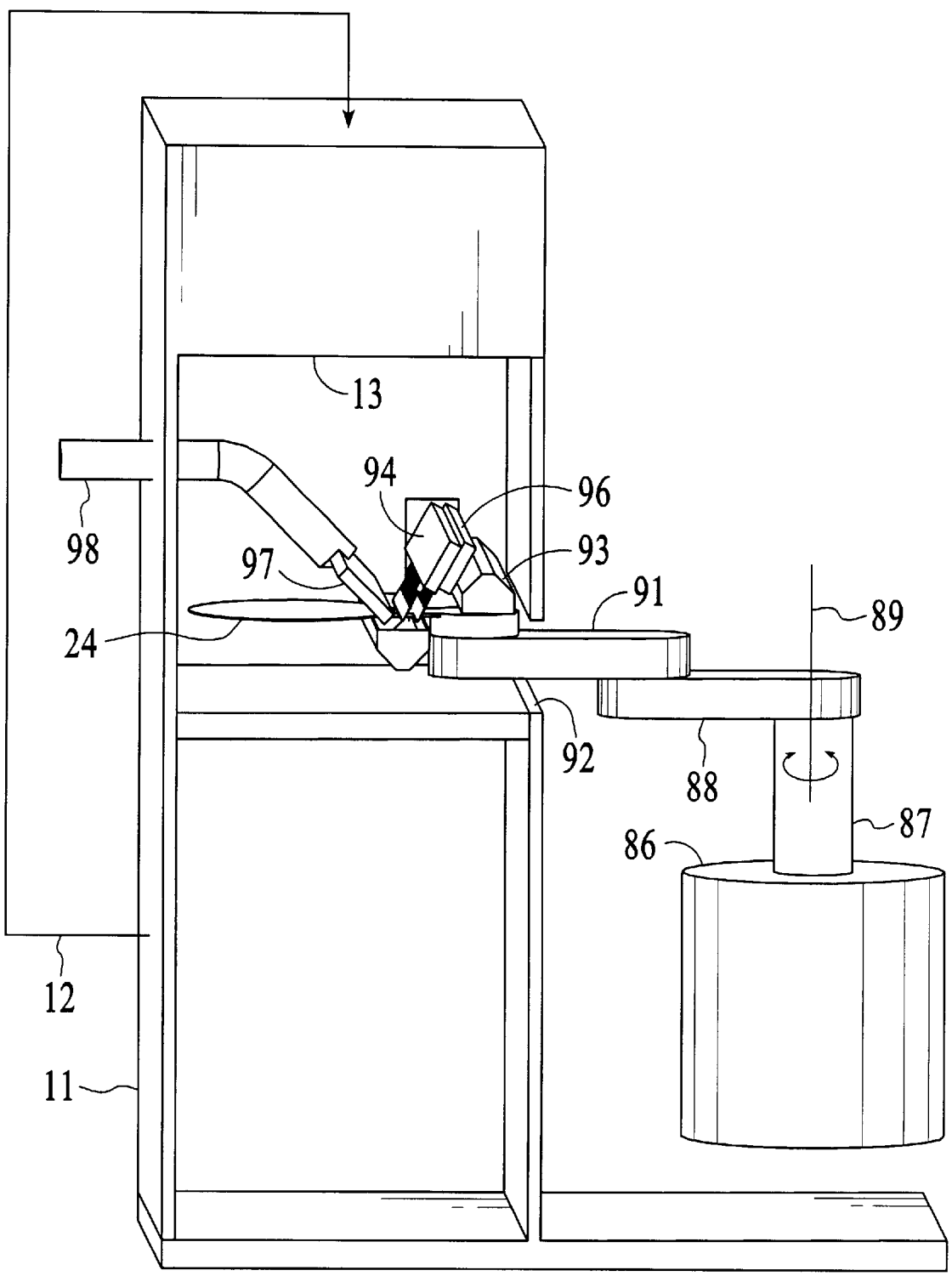
FIG. 5 is a perspective of an additional embodiment of the system of the present invention.

The embodiment of FIG. 5 depicts a robot 86 having an extendable and retractable arm 87, providing movement in a vertical direction, and a laterally extending arm segment 88 disposed for rotation about an axis 89 at the upper end of the arm 87. An additional robot arm 91 is provided that moves translationally in a horizontal direction. Translationally moving arm 91 extends through an egress/ingress port 92 in the enclosure 11 of FIG. 5 to insert an article having a surface to be cleaned, such as the integrated circuit wafer 24, into a controlled environment within the enclosure 11 as discussed in conjunction with the enclosure 11 of FIG. 1. The wafer 24 is shown at the limit of its insertion within the enclosure 11, having passed the pre-heater and post-heater combination 93 immediately inside the ingress/egress port. Wafer 24 is therefore pre-heated at the position shown in FIG. 5 and then withdrawn toward the ingress/egress port 92 to pass beneath a bank (plurality) of cleaning nozzles 94. The bank of nozzles extend across the entire dimension of the wafer, providing impingement by a plurality of fan shaped sprays on the surface to be cleaned, thereby cleaning the surface in a single pass beneath the bank of cleaning nozzles 94. Immediately following passage of the surface to be cleaned beneath the cleaning nozzles 94, an inert drying gas and anti-static electricity array 96 is positioned that also extends across the entire dimension of the wafer 24. As the wafer is withdrawn toward the ingress/egress port 92, the surface is dried by the inert drying gas nozzle array and after heated by the pre/post heater 93 to a temperature that will prohibit condensation on the clean surface as it is withdrawn from the enclosure 11 by the robot arm 91. Positioned adjacent the cleaning nozzle array 94 is a scavenging intake 97 that operates to remove particulates cleaned from the surface of the wafer 94 as well as particulates generated within the enclosure 11. Scavenging intake is connected to an exhaust 98, which carries the contaminants from within the enclosure to the ambient environment. Pressure within the enclosure 11 preferably is maintained slightly higher than ambient pressure to prevent contaminants from entering the enclosure through the ingress/egress port 92. Further, as in the description of the embodiment of FIG. 1, the scavenging line 12 is provided to withdraw the enclosed atmosphere and deliver it to the cleaning filter 13 to further reduce contaminants within the enclosure.

Figures 6, 7:
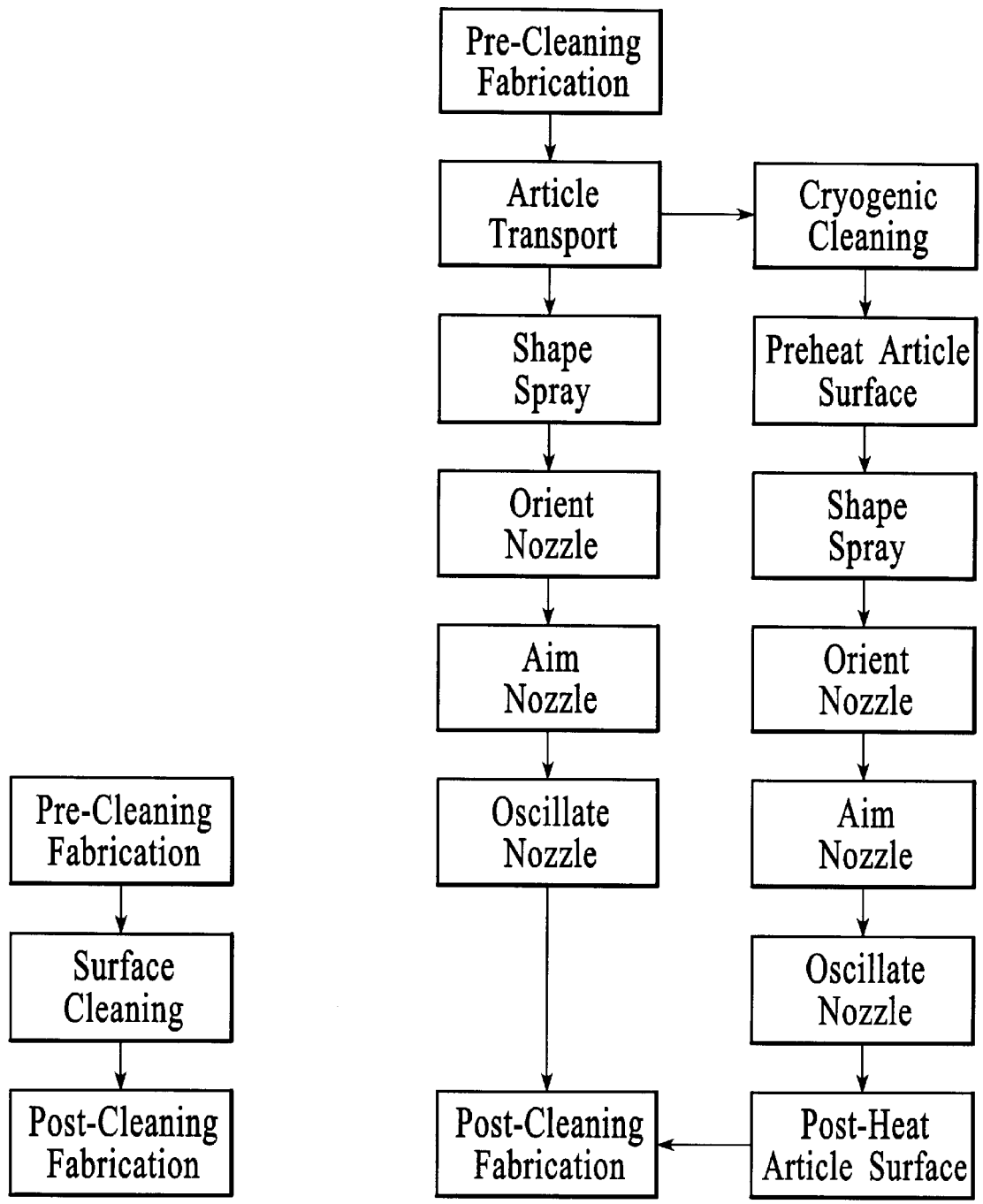
FIG. 6 is a block diagram relating to the process of the present invention.
FIG. 7 is another block diagram illustrating the details of the process of the present invention.

With regard to an exemplary preferred method in accordance with the present invention, there preferably exist certain pre-cleaning fabrication steps for the article having a surface to be cleaned followed by the step of cleaning the surface, and culminating in post-cleaning fabrication steps for the article having a surface to be cleaned. The block diagram of FIG. 6 depicts these steps. Details of a preferred surface cleaning process of FIG. 6 are found in the block diagram of FIG. 7. FIG. 7 illustrates the pre-cleaning fabrication steps of FIG. 6 followed by mounting the article having a surface to be cleaned on an article transport. In one embodiment of the cleaning process the article is transported to a cleaning position and the shape of the spray is configured to assume a fan shape. The spray nozzle in then oriented to cause the spray to impinge the surface to be cleaned at an angle to the lateral dimension of the surface as it passes the spray. This angle is called a compound angle. The nozzle is then aimed at the surface to be cleaned to form an obtuse angle with the surface relative to the approaching portion of the surface to be cleaned. Subsequently, the nozzle is oscillated so that the spray functions as a pulsing spray as the forward motion of the nozzle is added to the velocity of the cleaning spray during one portion of the oscillation cycle and is subtracted from the velocity of the cleaning spray during the subsequent portion of the oscillation cycle. Moreover, the orientation of the nozzle aperture and the fan-shaped spray about the nozzle axis preferably provides a "snow plow" effect facilitating cleaning as previously described. Subsequent to the cleaning by the oscillating fan-shaped spray the article preferably is moved onto the post-cleaning fabrication steps as illustrated in FIG. 7.

In another aspect of the cleaning process of the present invention a cryogenic cleaning medium is used. As mentioned hereinbefore an inert gas such as argon or $CO_2$ is in substantially solid or "snow" form as it is emitted from the nozzle so that sublimation of the gas occurs at the surface to be cleaned. In this process the surface to be cleaned preferably is preheated to a temperature such that the surface to be cleaned will remain at a temperature above ambient during the impingement of the cryogenic spray on the surface. The spray preferably is shaped into a fan shape and the spray nozzle aperture preferably is oriented about the nozzle access to provide impingement of the fan spray on the surface to be cleaned at an angle to the lateral dimension of the surface (the compound angle). The spray nozzle preferably is then aimed at the surface at an obtuse angle relative to the surface portion approaching the cleaning spray and the nozzle preferably is oscillated in a cyclic pattern having a pre-determined amplitude and frequency. The nozzle preferably oscillates in a substantially circular pattern in a plane including the nozzle axis so that the spray pattern is lateral and linear on the surface. Moreover, due to the orientation of the nozzle rotationally about the nozzle axis, the spray impinges the surface at the compound angle and performs a "snow plow" function. This function is believed to tend to push contaminants to one side of the surface to be cleaned. Following exposure to the oscillation cleaning spray, the surface preferably is post-heated to a temperature above ambient temperature to prevent condensation and recontamination of the surface and also to remove static charge. It should be noted that the step of shaping the spray preferably reside in both embodiments of the process described in conjunction with FIG. 7 and includes expanding the width of the cleaning spray to cover the lateral dimension of the surface to be cleaned. As a result, the cleaning of the surface may be obtained in a single pass of the surface to be cleaned past the spray. Subsequently the post-heated article surface is passed to the post-cleaning fabrication steps as seen in FIG. 7.

Although the invention has been described in conjunction with specific preferred and other embodiments, it is evident that many substitutions, alternatives and variations will be apparent to those skilled in the art in light of the foregoing description. Accordingly, the invention is intended to embrace all of the alternatives and variations that fall within the spirit and scope of the appended claims. For example, it should be understood that, in accordance with the various alternative embodiments described herein, various systems, and uses and methods based on such systems, may be obtained. The various refinements and alternative and additional features also described may be combined to provide additional advantageous combinations and the like in accordance with the present invention. Also as will be understood by those skilled in the art based on the foregoing description, various aspects of the preferred embodiments may be used in various subcombinations to achieve at least certain of the benefits and attributes described herein, and such subcombinations also are within the scope of the present invention. All such refinements, enhancements and further uses of the present invention are within the scope of the present invention.

Reference is also made to co-pending application Ser. No. 09/637,333 filed on even date herewith by the inventors here for "Apparatus For Cleaning Surfaces Substantially Free Of Contaminants."

What is claimed is:

1. A method of cleaning an article having a surface to be cleaned substantially free of contaminants, comprising the steps of:

transporting the surface to be cleaned to the cleaning position;

positioning the surface to be cleaned proximate to a cryogenic cleaning spray at the cleaning position, wherein the cryogenic cleaning spray is emitted along an axis; and oscillating the cryogenic cleaning spray at the cleaning position in a predetermined pattern, wherein the step of oscillating in a predetermined pattern comprises the step of cyclically converging upon and diverging from the surface to be cleaned and includes in and out movement along the axis of the cryogenic cleaning spray.

2. The method of claim 1, further comprising the steps of:

shaping the cryogenic cleaning spray to assume a fan shape, wherein the fan shape has a mean spray direction; and adjusting the orientation of the cryogenic cleaning spray about the mean spray direction.

3. The method of claim 2, wherein the method further comprises the steps of:

pre-heating the surface to be cleaned at a position reached during the step of transporting to the cleaning position; and post-heating the surface to be cleaned at a position reached during a step of transporting subsequent to the cleaning step.

4. The method of claim 1, further comprising the step of enclosing the surface to be cleaned in a controlled environment during the cleaning step.

5. The method of claim 1, wherein the step of oscillating comprises the steps of:
controlling the amplitude of oscillation to a predetermined level; and
controlling the frequency of oscillation to a predetermined value.

6. The method of claim 5, wherein the step of controlling the amplitude comprises the step of controlling the amplitude within the range of about 0.120 to 0.180 inches, and wherein the step of controlling the frequency comprises the step of controlling the frequency within the range of about 25–30 Hertz.

7. The method of claim 1, further comprising the step of directing the cryogenic cleaning spray at the surface to be cleaned at an obtuse angle to the approaching portion of the surface to be cleaned.

8. The method of claim 1, further comprising the steps of:
expanding the width of the cryogenic cleaning spray to cover the lateral dimension of the surface to be cleaned; and
cleaning the surface to be cleaned in a single pass.

9. The method of claim 1, whereby impingement of the cryogenic cleaning spray simulates spray pulsing and performs a "snow plow" function.

10. The method of claim 1, wherein the article comprises a hard disk, a semiconductor wafer or an optical article.

11. The method of claim 10, wherein the article is cleaned as part of a manufacturing process for the hard disk, semiconductor wafer or optical article.

12. The method of claim 1, wherein a nozzle forms the cryogenic cleaning spray, wherein the nozzle has an elongated opening.

13. The method of claim 12, wherein the cryogenic cleaning spray is emitted from the elongated opening in a fan shaped pattern.

14. The method of claim 13, wherein the elongated opening is rotated about a nozzle axis, wherein the fan shaped pattern of the cryogenic cleaning spray impinges upon the article at a first angle.

15. The method of claim 14, wherein the nozzle is securably positioned with respect to the article, wherein the nozzle axis and a direction of movement of the article through the cleaning position define a second angle, different from the first angle.

16. The method of claim 15, wherein the nozzle axis and a line pointing in the direction of movement define an acute angle.

17. The method of claim 1, wherein the cryogenic cleaning spray is emitted from a plurality of nozzles.

18. The method of claim 17, wherein the article moves through the cleaning position and the article is cleaning in a single pass.

19. The method of claim 1, wherein the cryogenic cleaning spray is formed from a cleaning medium, wherein the method further comprises the step of filtering the cleaning medium.

20. The method of claim 19, wherein a storage vessel holds the cleaning medium, wherein the filtering is performed after the cleaning medium leaves the storage vessel but prior to the cryogenic cleaning spray being emitted from a nozzle.

21. The method of claim 20, wherein the cleaning medium comprises carbon dioxide.

22. The method of claim 1, wherein the cryogenic cleaning spray comprises carbon dioxide.

23. The method of claim 1, further comprising the step of providing an inert gas to the surface to be cleaned.

24. The method of claim 23, wherein the inert gas is provided to the surface to be cleaning in an oscillating pattern.

25. The method of claim 1, wherein the oscillating step is performed using a motor assembly, wherein the motor assembly is enclosed in a housing that is under vacuum.

26. A method of processing an article having a surface to be cleaned substantially free of contaminants, comprising the steps of:
performing a plurality of pre-cleaning fabrication steps;
conducting a cleaning process at a cleaning position using a cryogenic cleaning spray, wherein the cryogenic cleaning spray is emitted along an axis; and
performing a plurality of post-cleaning fabrication steps, wherein the step of conducting a cleaning process comprises the steps of:
transporting the surface to be cleaned to the cleaning position;
positioning the surface to be cleaned proximate to the cryogenic cleaning spray at the cleaning position; and
oscillating the cryogenic cleaning spray at the cleaning position in a predetermined pattern, wherein the step of oscillating in a predetermined pattern comprises the step of cyclically converging upon and diverging from the surface to be cleaned and includes in and out movement along the axis of the cryogenic cleaning spray.

27. The method of claim 26, wherein the cleaning process further comprises the steps of:
shaping the cryogenic cleaning spray to assume a fan shape, wherein the fan shape has a mean spray direction; and
adjusting the orientation of the cryogenic cleaning spray about the mean spray direction.

28. The method of claim 27, wherein the cleaning process further comprises the steps of:
pre-heating the surface to be cleaned at a position reached during the step of transporting previous to the cleaning position; and
post-heating the surface to be cleaned at a position reached during the step of transporting subsequent to the cleaning position.

29. The method of claim 26, wherein the cleaning process further comprises the step of enclosing the surface to be cleaned in a controlled environment during the cleaning process.

30. The method of claim 26, wherein the step of oscillating comprises the steps of:
controlling the amplitude of oscillation to a predetermined level; and
controlling the frequency of oscillation to a predetermined value.

31. The method of claim 26, wherein the step of controlling the amplitude comprises the step of controlling the amplitude within the range of about 0.120 to 0.180 inches, and wherein the step of controlling the frequency comprises the step of controlling the frequency within the range of about 25–30 Hertz.

32. The method of claim 26, wherein the cleaning process further comprises the step of directing the cryogenic cleaning spray at the surface to be cleaned at an obtuse angle to the approaching portion of the surface to be cleaned.

33. The method of claim 26, further comprising the steps of:
expanding the width of the cryogenic cleaning spray to cover the lateral dimension of the surface to be cleaned; and
cleaning the surface to be cleaned in a single pass.

34. The method of claim 26, wherein impingement of the cryogenic cleaning spray simulates spray pulsing and performs a "snow plow" function.

35. The method of claim 26, wherein the article comprises a hard disk, a semiconductor wafer or an optical article.

36. The method of claim 35, wherein the article is cleaned as part of a manufacturing process for the hard disk, semiconductor wafer or optical article.

37. The method of claim 26, wherein a nozzle forms the cryogenic cleaning spray, wherein the nozzle has an elongated opening.

38. The method of claim 37, wherein the cryogenic cleaning spray is emitted from the elongated opening in a fan shaped pattern.

39. The method of claim 38, wherein the elongated opening is rotated about a nozzle axis, wherein the fan shaped pattern of the cryogenic cleaning spray impinges upon the article at a first angle.

40. The method of claim 39, wherein the nozzle is securably positioned with respect to the article, wherein the nozzle axis and a direction of movement of the article through the cleaning position define a second angle, different from the first angle.

41. The method of claim 40, wherein the nozzle axis and a line pointing in the direction of movement define an acute angle.

42. The method of claim 26, wherein the cryogenic cleaning spray is emitted from a plurality of nozzles.

43. The method of claim 42, wherein the article moves through the cleaning position and the article is cleaning in a single pass.

44. The method of claim 26, wherein the cryogenic cleaning spray is formed from a cleaning medium, wherein the method further comprises the step of filtering the cleaning medium.

45. The method of claim 44, wherein a storage vessel holds the cleaning medium, wherein the filtering is performed after the cleaning medium leaves the storage vessel but prior to the cryogenic cleaning spray being emitted from a nozzle.

46. The method of claim 45, wherein the cleaning medium comprises carbon dioxide.

47. The method of claim 26, wherein the cryogenic cleaning spray comprises carbon dioxide.

48. The method of claim 26, further comprising the step of providing an inert gas to the surface to be cleaned.

49. The method of claim 48, wherein the inert gas is provided to the surface to be cleaning in an oscillating pattern.

50. The method of claim 26, wherein the oscillating step is performed using a motor assembly, wherein the motor assembly is enclosed in a housing that is under vacuum.

* * * * *